United States Patent [19]
Williams et al.

[11] Patent Number: 5,781,036
[45] Date of Patent: Jul. 14, 1998

[54] PHASE DETECTOR

[75] Inventors: Scott Lindsey Williams, Tigard; Benjamin J. McCarroll, Portland, both of Oreg.

[73] Assignee: Maxim Integrated Products, Inc., Sunnyvale, Calif.

[21] Appl. No.: 834,713

[22] Filed: Apr. 1, 1997

[51] Int. Cl.$^6$ .................................................. H03L 7/00
[52] U.S. Cl. ..................... 327/2; 327/3; 327/7; 327/148; 327/157; 327/538
[58] Field of Search .............................. 327/2, 3, 7, 8, 327/148, 157, 536, 537, 538, 541, 543; 331/17, 25

[56] References Cited

U.S. PATENT DOCUMENTS

| | | | |
|---|---|---|---|
| 4,099,876 | 7/1978 | Dorsman | 356/106 LR |
| 4,215,280 | 7/1980 | Mahig | 307/295 |
| 4,862,105 | 8/1989 | Walbrou et al. | 331/1 A |
| 5,239,455 | 8/1993 | Fobbester et al. | 363/60 |

*Primary Examiner*—Timothy P. Callahan
*Assistant Examiner*—An T. Luu
*Attorney, Agent, or Firm*—Blakely, Sokoloff, Taylor & Zafman LLP

[57] ABSTRACT

A phase detector biased in a manner to alleviate the mismatch between the biasing current sources and the phase detector core bias currents. The bias setting resistors are coupled together at a common node that forms the negative input of a differential feedback amplifier. The positive input to the amplifier is referenced to a reference voltage, and the output of the amplifier controls the biasing current sources. The feedback amplifier forces the average voltage at the current source outputs to approximately match the reference voltage applied to its positive input. Thus the average bias current from the bias current sources is forced to track the average bias currents of the phase detector core.

2 Claims, 1 Drawing Sheet

PHASE DETECTOR

BACKGROUND OF THE INVENTION

1. Field of the Invention

This invention relates to the field of phase detectors, and more particularly to phase detectors as are commonly used in phase locked loops.

2. Prior Art

FIG. 1 shows a conventional high gain phase detector circuit. The phase detector core P1 has two phase inputs IN1 and IN2, along with differential current outputs OP and ON. The purpose of the phase detector core is to provide differential current outputs responsive to the difference in phase or phase error between the inputs IN1 and IN2.

The phase detector core outputs are loaded with current sources I1 and I2, each in parallel with one of the large valued bias setting resistors R1 and R2. These bias setting resistors, along with a reference voltage VREF, set the DC voltages present at the current source outputs N1 and N2. Also, the resistor values of R1 and R2 are proportional to the phase detector gain, the larger the resistor values, the larger the gain.

The problem with this technique is that normal integrated circuit mismatches between the current source and phase detector P1 bias currents must be absorbed by the bias setting resistors R1 and R2. This mismatch current must flow through the bias setting resistors, and thus changes the intended bias voltages at N1 and N2. A large mismatch in the bias currents will lead to a large deviation from the intended bias voltage and can cause saturation or compression of either the current source or the phase detector core.

This may be illustrated as also shown in FIG. 1. Ideally the two currents I1 and I2 will be equal to each other and also exactly equal to the corresponding bias currents for the detector outputs OP and ON. In practice however, I1, I2 and the bias currents for OP and ON will differ from the ideal. Assume for instance that the input phase difference between the inputs IN1 and IN2 is zero, and that I1 and/or the bias current for OP differ from the ideal values, so that $I_{OP}=I1+\Delta I$. Since the net current into the node N1 must be zero, the extra bias current $\Delta I$ must be provided from VREF through R1. The output voltage $V_{N1}$ at node N1 will not be VREF, but rather $VREF-\Delta I*R1$. The larger the bias setting resistors, the larger the gain (voltage output for a given phase error input), but the larger the output offset will be. Thus, there is a significant tradeoff between the bias setting resistor values and the allowable current mismatch or circuit yield. Reducing the bias resistor value allows for more mismatch, but decreases the phase detector gain.

BRIEF SUMMARY OF THE INVENTION

A phase detector biased in a manner to alleviate the mismatch between the biasing current sources and the phase detector core bias currents. The output resistors are coupled together at a common node that forms the negative input of a differential feedback amplifier. The positive input to the amplifier is referenced to a reference voltage, and the output of the amplifier controls the biasing current sources. The feedback amplifier forces the average voltage at the current source outputs to approximately match the reference voltage applied to its positive input. Thus the average bias current from the bias current sources is forced to track the average bias currents of the phase detector core. As a result, and unlike the conventional biasing technique, the bias setting resistor values may be large to set a high phase detector gain without significantly disturbing the bias voltages at nodes N1 and N2.

DETAILED DESCRIPTION OF THE INVENTION

Figure 1:
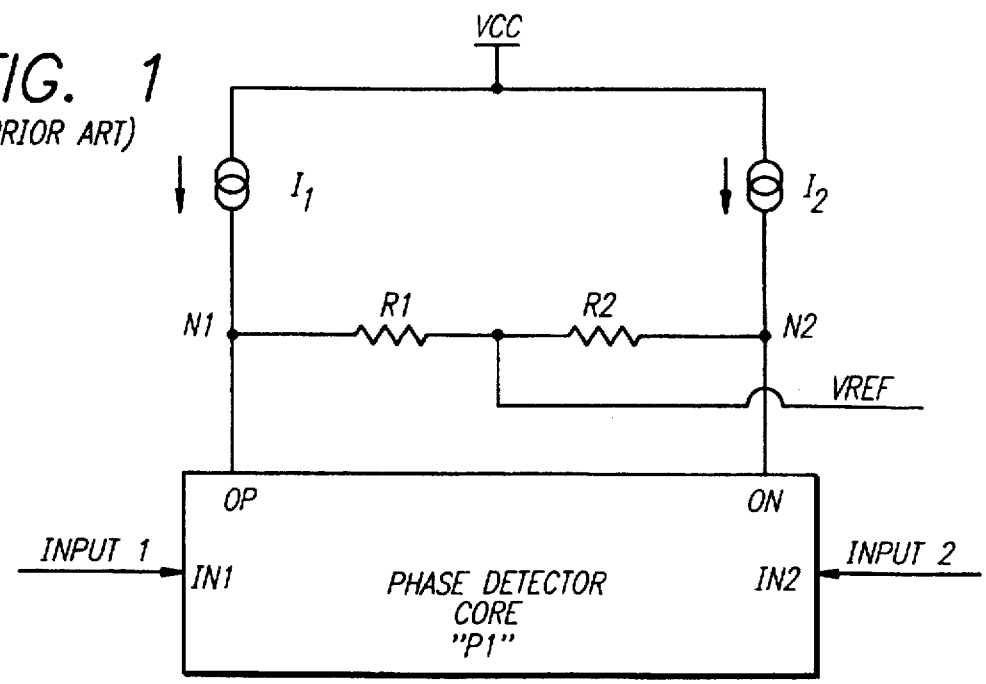
FIG. 1 is a diagram conventional high gain phase detector circuit.
Figure 2:
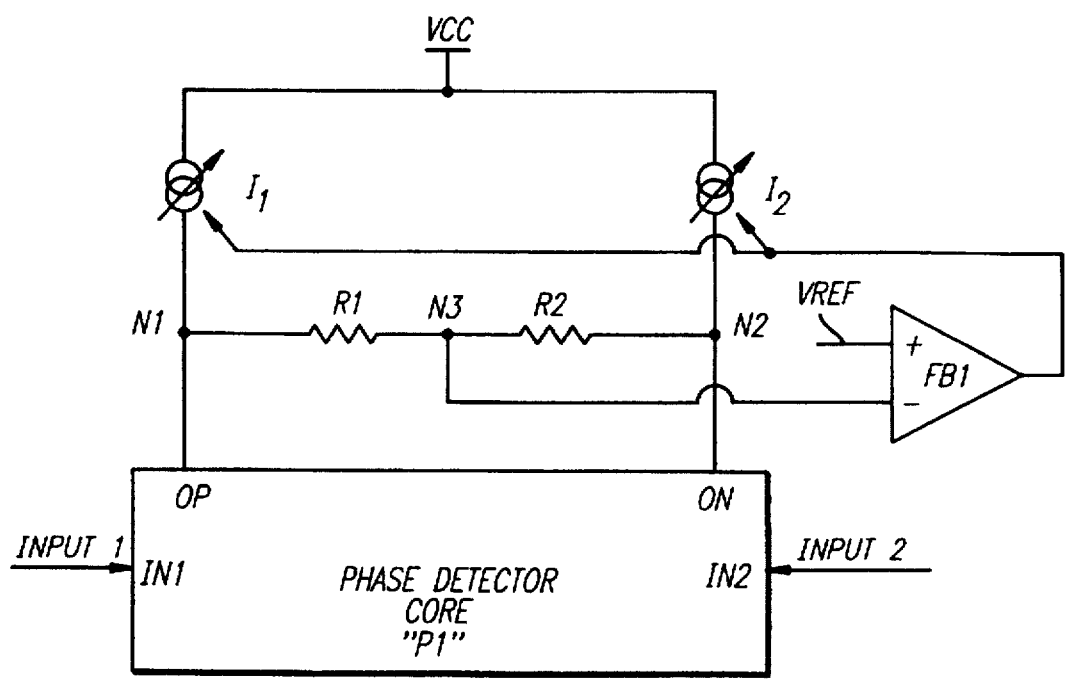
FIG. 2 is a diagram of the preferred embodiment of the present invention.

FIG. 2 shows the preferred embodiment of the present invention, which biases the phase detector in a manner to alleviate the mismatch between the current sources I1 and I2 and phase detector core P1 bias currents. The feedback amplifier FB1 forces the average voltage (or common mode voltage) at the current source outputs N1 and N2 to match the reference voltage VREF applied to its positive input. The phase detector current source currents, now inside the feedback loop, are adjusted to match the bias currents of the phase detector core. Unlike the conventional biasing technique, the bias setting resistor (R1 and R2) values may be large to set a high phase detector gain without disturbing the bias voltages at nodes N1 and N2.

In a typical integrated circuit manufacturing process, I1 and I2 may be quite well matched. Similarly, the bias currents for OP and ON will be quite well matched. However the current sources I1 and I2 will not normally as accurately match the bias currents for OP and ON, respectively, particularly over the entire operating temperature range. The feedback of the voltage at node N3 to control the current sources I1 and I2 forces the average of the current sources I1 and I2 to approximately equal (and track) the average of the bias currents for OP and ON. This may be shown by assuming that I1 and I2 are equal and track each other, and that the bias currents for OP and ON are equal and track each other. In this case, the voltages of nodes N1 and N2 will be equal and track each other, so that assuming a high input impedance for the differential feedback amplifier FB1, the voltage of node N3 will be equal to and track the voltage of nodes N1 and N2. Consequently the feedback amplifier FB1 will adjust I1 and I2 so that the voltage at node N3, and thus the voltage at nodes N1 and N2, will equal VREF, eliminating the mismatch between the average of current sources I1 and I2, and the average of the bias currents for OP and ON due to manufacturing, temperature or other variations. While the effects of the mismatch between current sources I1 and I2 themselves will remain, as well as the effects of the mismatch between the bias currents for OP and ON, by design these mismatches should be small in an integrated circuit phase detector. Thus, larger valued resistors may be used than in the prior art while still maintaining the phase detector output offsets within acceptable limits, thereby resulting in a higher gain in the phase detector.

While a preferred embodiment of the present invention has been disclosed and described herein, it will be obvious to those skilled in the art that various changes in form and detail may be made therein without departing from the spirit and scope of the invention.

What is claimed is:

1. A phase detector comprising:
   a phase detector core having first and second inputs and first and second outputs, the first and second outputs having first and second bias currents, respectively, and providing a differential output current responsive to the difference in phase in two signals applied to the first and second inputs;
   first and second current sources biasing the first and second phase detector core outputs, respectively;

first and second resistors coupled in series between the first and second phase detector core outputs and having a common node between the first and second resistors; and, a feedback amplifier responsive to the difference in the voltage of the common node and a reference voltage controlling the first and second current sources.

2. A method of reducing the bias current mismatches in a phase detector comprising the steps of:

providing:
    a phase detector core having first and second inputs and first and second outputs, the first and second outputs having first and second bias currents, respectively, and providing a differential output current responsive to the difference in phase in two signals applied to the first and second inputs;

first and second current sources biasing the first and second phase detector core outputs, respectively; and, first and second resistors coupled in series between the first and second phase detector core outputs and having a common node between the first and second resistors;

controlling the first and second current sources to force the voltage of the common node to equal a reference voltage.

* * * * *